US 8,207,606 B2

(12) United States Patent
Shin

(10) Patent No.: US 8,207,606 B2
(45) Date of Patent: Jun. 26, 2012

(54) SEMICONDUCTOR DEVICE

(75) Inventor: Seung-Woo Shin, Suwon-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 451 days.

(21) Appl. No.: 12/485,965

(22) Filed: Jun. 17, 2009

(65) Prior Publication Data
US 2010/0013077 A1 Jan. 21, 2010

(30) Foreign Application Priority Data

Jul. 21, 2008 (KR) ........................ 10-2008-0070735

(51) Int. Cl.
H01L 23/053 (2006.01)
H01L 23/12 (2006.01)

(52) U.S. Cl. ................. 257/700; 257/E23.141; 257/737; 257/778; 257/781; 438/106; 438/108; 438/612

(58) Field of Classification Search ........... 257/E23.141, 257/690, 693, 700, 734, 723, 737, 738, 758, 257/781, E23.011, E23.085, 778, 779; 438/106, 438/108, 113, 119, 458, 460, 612, 613, 622
See application file for complete search history.

(56) References Cited

U.S. PATENT DOCUMENTS

| 5,834,844 | A | * | 11/1998 | Akagawa et al. | ............. | 257/734 |
|---|---|---|---|---|---|---|
| 6,118,179 | A | | 9/2000 | Farnworth et al. | | |
| 6,228,687 | B1 | * | 5/2001 | Akram et al. | ................. | 438/125 |
| 6,437,432 | B2 | * | 8/2002 | Ikumo et al. | .................. | 257/691 |
| 6,586,273 | B2 | | 7/2003 | Aiba et al. | | |
| 6,596,560 | B1 | * | 7/2003 | Hsu | ............................... | 438/108 |
| 6,838,748 | B2 | | 1/2005 | Ishio et al. | | |
| 6,841,883 | B1 | * | 1/2005 | Farnworth et al. | ............ | 257/777 |
| 6,897,089 | B1 | * | 5/2005 | Farnworth | ..................... | 438/106 |
| 6,906,418 | B2 | * | 6/2005 | Hiatt et al. | ..................... | 257/738 |
| 7,163,843 | B2 | | 1/2007 | Kiendl et al. | | |
| 7,173,330 | B2 | * | 2/2007 | Eng et al. | ...................... | 257/700 |
| 7,227,263 | B2 | * | 6/2007 | Yamaguchi | ................... | 257/738 |
| 7,952,170 | B2 | * | 5/2011 | Pratt | ............................. | 257/621 |
| 7,964,948 | B2 | * | 6/2011 | Lee et al. | ...................... | 257/686 |
| 8,084,854 | B2 | * | 12/2011 | Pratt et al. | ..................... | 257/698 |
| 2004/0201097 | A1 | * | 10/2004 | Ohsumi | ........................ | 257/737 |
| 2006/0154447 | A1 | | 7/2006 | Kushima et al. | | |

FOREIGN PATENT DOCUMENTS

| JP | 09-064078 | 3/1997 |
|---|---|---|
| JP | 2000-349114 | 12/2000 |
| JP | 2002-184904 | 6/2002 |
| JP | 2002-299546 | 10/2002 |
| JP | 2004-335629 | 11/2004 |
| JP | 2005-123456 | 5/2005 |
| JP | 2005-210012 | 8/2005 |
| JP | 2006-294685 | 10/2006 |

(Continued)

Primary Examiner — Chris Chu
(74) Attorney, Agent, or Firm — Stanzione & Kim, LLP

(57) ABSTRACT

A semiconductor device includes a semiconductor chip having a top surface on which a first conductive pad is disposed, a bottom surface opposite to the top surface, and a side surface connecting the top and bottom surfaces to each other, a first reinforcement layer on the top surface of the semiconductor chip, a first absorption layer between the top surface of the semiconductor chip and the first reinforcement layer to absorb a stress resulting from a difference in thermal expansion coefficient between the first reinforcement layer and the semiconductor chip, and a connection terminal disposed on the first reinforcement layer and electrically connected to the first conductive pad.

19 Claims, 6 Drawing Sheets

FOREIGN PATENT DOCUMENTS

| KR | 2000-20421 | 4/2000 |
| KR | 2000-40584 | 7/2000 |
| KR | 2001-3211 | 1/2001 |
| KR | 2001-56778 | 7/2001 |
| KR | 2002-46134 | 6/2002 |
| KR | 2007-21200 | 2/2007 |

* cited by examiner

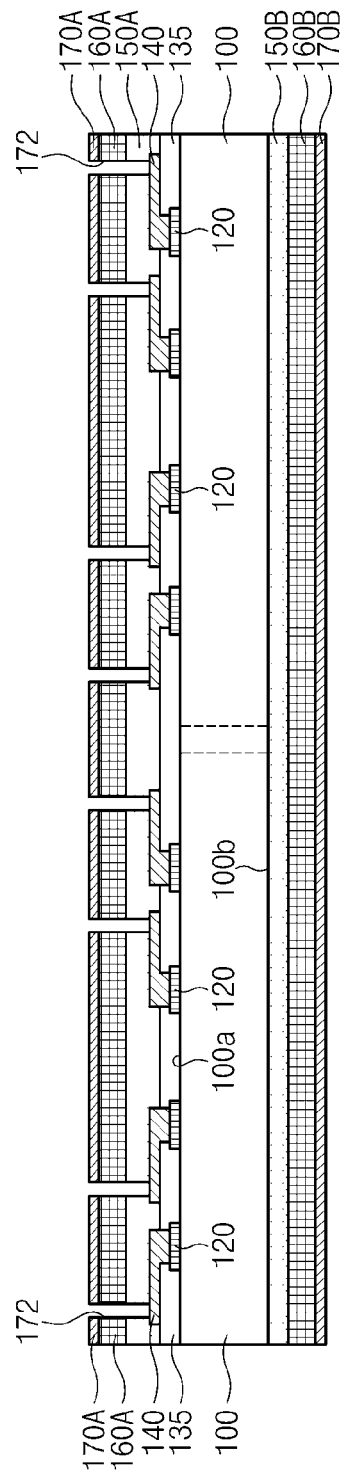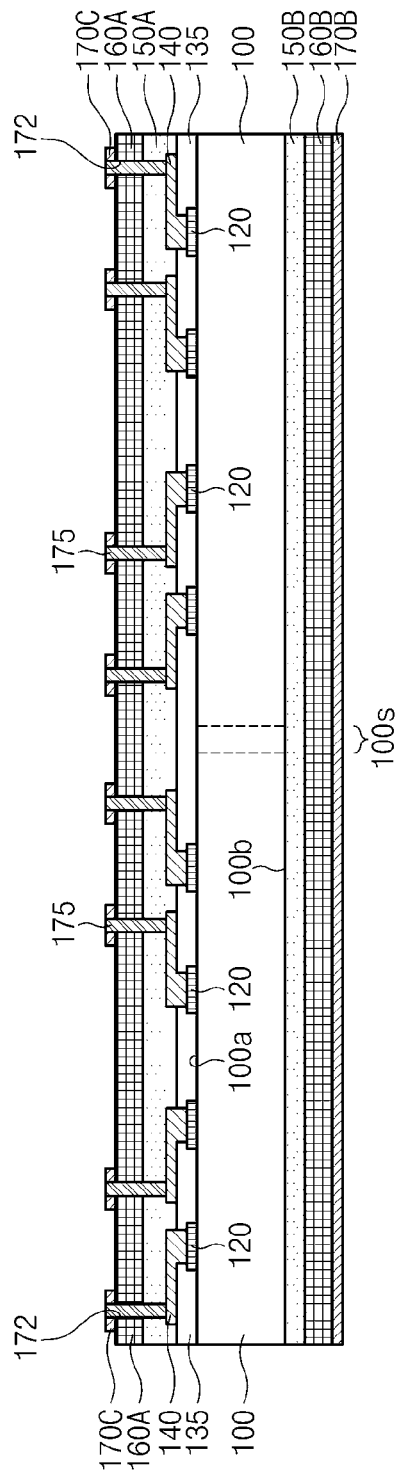

SEMICONDUCTOR DEVICE

CROSS-REFERENCE TO RELATED APPLICATIONS

This U.S. non-provisional patent application claims priority under 35 U.S.C §119 from Korean Patent Application No. 10-2008-0070735, filed on Jul. 21, 2008, in the Korean Intellectual Property Office (KIPO), the entirety of which is incorporated herein by reference.

BACKGROUND

1. Field of the Invention

Example embodiment of the present general inventive concept relates to semiconductor devices and methods of manufacturing the same. More specifically, the example embodiment of the present general inventive concept is directed to semiconductor packages, methods of manufacturing the same, and an electronic apparatus using the same.

2. Description of the Related Art

An electronic apparatus becomes lighter, smaller, faster, multi-functional, and high-quality products. A semiconductor package technology has improved the electronic apparatus in function and size.

A recently developed semiconductor package technology is a wafer level chip scale package (WL-CSP), which uses redistribution or rerouting of a bonding pad. A WL-CSP using redistribution of a bonding pad is manufactured by directly redistributing a chip pad on a semiconductor chip to a larger chip pad than the chip pad in a semiconductor fabrication plant (FAB) and forming an external connection terminal, such as solder ball or bonding wire, thereon.

SUMMARY

Exemplary embodiments of the present general inventive concept provide a semiconductor device. In an exemplary embodiment, the semiconductor device may include a semiconductor chip having a top surface on which a first conductive pad is disposed, a bottom surface opposite to the top surface, and a side surface connecting the top and bottom surfaces to each other. A first reinforcement layer may be disposed on the top surface of the semiconductor chip. A first absorption layer may be interposed between the top surface of the semiconductor chip and the first reinforcement layer to absorb a stress resulting from a difference in thermal expansion coefficient between the first reinforcement layer and the semiconductor chip. A connection terminal may be disposed on the first reinforcement layer and electrically connected to the first conductive pad.

Additional aspects and utilities of the present general inventive concept will be set forth in part in the description which follows and, in part, will be obvious from the description, or may be learned by practice of the general inventive concept.

Exemplary embodiments of the present general inventive concept provide a method of manufacturing a semiconductor device. In an exemplary embodiment, the method may include providing a substrate having a top surface on which a first conductive pad is disposed and a bottom surface opposite to the top surface, forming a first absorption layer on the top surface of the substrate, forming a first reinforcement layer on the first absorption layer, and forming a connection terminal on the first reinforcement layer to be electrically connected to the first conductive pad.

Exemplary embodiments and utilities of the present general inventive concept provide a semiconductor device including a semiconductor package comprising, a semiconductor chip, a layer disposed on the semiconductor chip and formed with a pad electrically connected to the semiconductor chip, and an absorption layer formed between the semiconductor chip and the layer to absorb a force between the semiconductor and the layer.

The layer may include a reinforcement layer having a thermal expansion coefficient different from the semiconductor chip.

The semiconductor chip may include a first surface and a second surface, the first surface may be formed with the layer and the absorption layer; and the second surface may be formed with a second layer and a second absorption layer.

The semiconductor device may further include an insulating layer formed between the semiconductor chip and the absorption layer.

The layer may have a thickness different from a thickness of the second layer, and the absorption layer may have a thickness different from a thickness of the second absorption layer.

The absorption layer may have a thickness determined according to a characteristic of one of the semiconductor chip and the layer.

The semiconductor device may have a mounting substrate mounted with the semiconductor package, and one or more connecting terminals formed between the mounting substrate and the corresponding pad of the semiconductor package.

The connecting terminals may have a thickness thicker than a thickness of at least one of the layer and the absorption layer.

The mounting substrate may include a substrate pad and a conductor wiring to electrically connect the substrate pad and the semiconductor chip, and the mounting substrate may have a length longer than the semiconductor package.

Exemplary embodiments and utilities of the present general inventive concept provide an electronic apparatus including a semiconductor package having a semiconductor chip, a layer disposed on the semiconductor chip and formed with a pad electrically connected to the semiconductor chip, and an absorption layer formed between the semiconductor chip and the layer to absorb a force between the semiconductor and the layer, and a unit electrically connected to the pad to perform an operation as a function unit thereof.

The electronic apparatus may further include an REID unit to perform a communication with an external device using data stored in the semiconductor chip of the semiconductor package.

The absorption layer may have a thickness determined according to at least one characteristic of at least one of the semiconductor chip and an element disposed adjacent to the semiconductor chip.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIGS. 2A through 2F are cross-sectional views illustrating a method of manufacturing a semiconductor device according to an embodiment of the present general inventive concept.

DETAILED DESCRIPTION OF THE EMBODIMENTS

Figure 1:
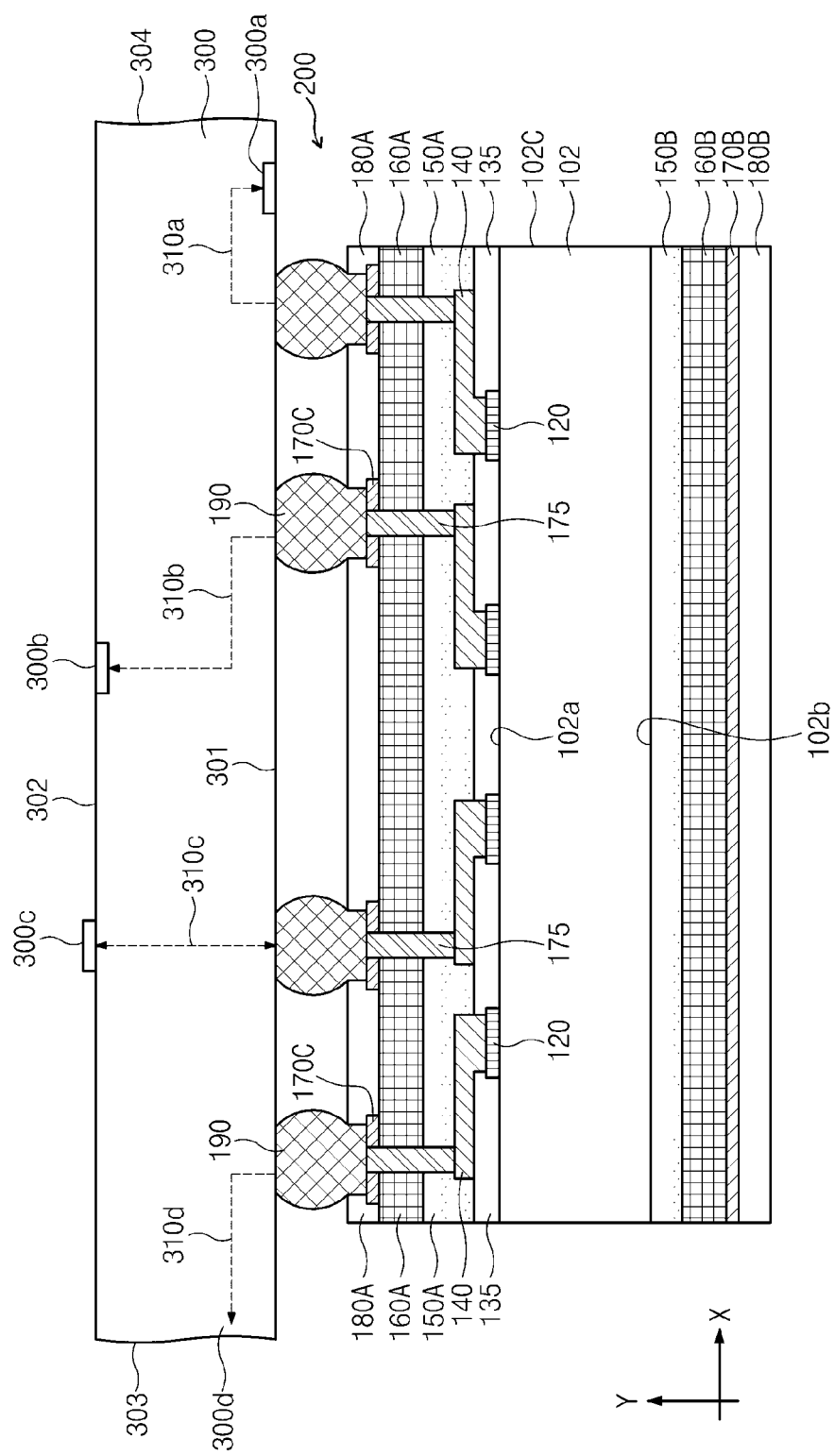
FIG. 1 is a cross-sectional view of a semiconductor device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. This general inventive concept, however, may be embodied in many different forms and should not be construed as limited to the embodiments set forth herein. Rather, these embodiments are provided so that this disclosure will be thorough and complete, and will fully convey the scope of the general inventive concept to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a cross-sectional view illustrating a semiconductor device according to an embodiment of the present general inventive concept. The semiconductor device includes a semiconductor package 200 and a mounting substrate 300 to which the package 200 is mounted. The mounting substrate 300 may be, for example, a substrate including a resin. The mounting substrate 300 may further include a conductive wiring provided therein to transmit electrical signals between the semiconductor package 200 and an external device.

The semiconductor package 200 may be, for example, a wafer level chip scale package (WL-CSP). The package 200 includes a semiconductor chip 102 having a top surface 102a, a bottom surface 102b, and a side surface 102c. The semiconductor chip 102 includes silicon. The side surface 102c may correspond to a surface cut along scribe lanes provided to divide one chip of a silicon wafer into a plurality of semiconductor chip units. The bottom surface 102b may be, for example, a surface subjected to a substrate thinning process such as a bottom polishing process. The bottom surface and/or the top surface may be parallel to an X direction, and the side surface may be parallel to a Y direction An integrated circuit (not illustrated) is formed at the semiconductor chip 102. The integrated circuit may be semiconductor memory cells and a controller to control the semiconductor memory cells to store data corresponding to the electrical signal and read and output the stored data to an external device. The integrated circuit may be a memory circuit unit to store data or a data processing circuit unit to process data. A plurality of first conductive pads 120 may be arranged on the top surface 102a of the semiconductor chip 102. The first conductive pads 120 are electrically connected to the integrated circuit. The first conductive pads 120 may be made of a conductive material such as metal or, e.g., aluminum (Al), nickel (Ni) or a combination thereof. A first insulating layer 135 is disposed on the top surface 102a. The first insulating layer 135 may cover the top surface 102a while exposing the first conductive pad 120. The first insulating layer 135 may be made of, for example, oxide, nitride or a polymeric dielectric material such as polyimide. A rerouting pattern 140 is disposed on the first insulating layer 135. The rerouting pattern 140 may be electrically connected to the first conductive pad 120 and extend along a top surface of the first insulating layer 135. The rerouting pattern 140 may be made of a conductive material such as metal or alloy having a relatively high electroconductivity, e.g., copper (Cu), aluminum (Al), nickel (Ni), platinum (Pt), silver (Ag), gold (Au) or combinations thereof.

A first absorption layer 150A is disposed on the first insulating layer 135 to cover the rerouting pattern 140. A first reinforcement layer 160A is disposed on the first absorption layer 150A. The first absorption layer 150A may include a material having a smaller elastic modulus than the first reinforcement layer 160A and the semiconductor chip 102 have. The first absorption layer 150A may include, for example, an epoxy or acryl-based liquid or film type adhesive or a silicon-based liquid or film type adhesive.

The first reinforcement layer 160A may include an electrical insulating layer having the same thermal expansion coefficient as the mounting substrate 300 has. The first reinforcement layer 160A may include a material having a thermal expansion coefficient between those of the semiconductor chip 102 and the mounting substrate 300. The first reinforcement layer 160A may include, for example, fiber reinforced plastics. The first reinforcement layer 160A may be made of, for example, an epoxy-embedded glass fiber. A resin-embedded glass fiber may exhibit a superior mechanical strength, which is comparable with that of a metallic material. A substrate thinning process may cause the strength of the semiconductor chip 102 to be weakened, which may be compensated by the first reinforcement layer 160A. An end surface of the first reinforcement layer 160A and an end surface of the first absorption layer 150A may be coplanar with the side surface 102c of the semiconductor chip 102.

In an exemplary embodiment, the first reinforcement layer 160A and the first absorption layer 150A may be interposed between a connection terminal 190 and the first insulating layer 135 to provide a semiconductor device having improved mechanical strength and reliability. That is, the connection terminal 190 may be interposed between the first reinforcement layer 160A and the mounting substrate 300. The first reinforcement layer 160A may exhibit a high mechanical strength itself and exhibit the substantially same thermal expansion coefficient as the mounting substrate 300 or between those of the semiconductor chip 102 or the mounting substrate 300. Therefore, it is possible to suppress defect of the connection terminal 190 which results from a difference in thermal expansion coefficient between the mounting substrate 300 and the semiconductor chip 102. The thermal expansion coefficient of the semiconductor chip 102 may be substantially equal to that of a layer of silicon that the semiconductor chip 102 includes. For this reason, the thermal expansion coefficient of the semiconductor chip 102 may be smaller than that of the mounting substrate 300.

The first absorption layer 150A may be interposed between the first reinforcement layer 160A and the first insulating layer 135 to absorb a stress resulting from a difference in thermal expansion coefficient between the first reinforcement layer 160A and the semiconductor chip 102. In addition, the first absorption layer 150A may ensure reliable bonding of the first reinforcement layer 160A to the semiconductor chip 102. That is, the first absorption layer 150A having a low elastic modulus may absorb a stress resulting from a difference in thermal expansion coefficient between the first reinforcement layer 160A and the semiconductor chip 102. Moreover, lack of bonding strength between the first reinforcement layer 160A and the first insulating layer 135 may be reduced to enhance reliability of a semiconductor device including the semiconductor package 200 according to the embodiment of the present invention. For example, in a heat or bending test for a semiconductor device, the semiconductor device including the semiconductor package 200 may secure reliability which is equivalent to that of a semiconductor device including a plastic package. The plastic package may include connection terminals disposed on a top surface of a substrate to which a semiconductor chip is attached and a bottom surface which is opposite to the top surface. The connection terminals are electrically connected to a mounting substrate to which the plastic package is mounted.

According to the embodiment of the present general inventive concept, thicknesses of the first reinforcement layer 160A and the first absorption layer 150A may be determined according to one or more characteristics of the semiconductor package 200 and other devices connected to the semiconductor package. For example, the thicker the first reinforcement layer 160A, the greater a mechanical strength thereof. Thus, a stress resulting from a difference in thermal expansion coefficient between the semiconductor chip 102 and the first mounting substrate 300 may be reduced. As a result, thermal and mechanical life cycle of the connection terminals 190 may increase.

The thicker the first absorption layer 150A, the less a stress resulting from a difference in thermal expansion coefficient between the first reinforcement layer 160A and the semiconductor chip 102. However, the total thickness of the first reinforcement layer 160A and the first absorption layer 150A may be properly maintained considering the thickness of the semiconductor package 200. The total thickness thereof may be 0.3 millimeter or less.

A second conductive pad 170C is disposed on the first reinforcement layer 160A. The second conductive pad 170C may comprise, for example, a plurality of conductive pads disposed adjacent to the side surface of the semiconductor chip 102. The second conductive pads 170C may be made of a conductive material such as metal or alloy having a superior electroconductivity, e.g., copper (Cu), aluminum (Al), nickel (Ni), platinum (Pt), silver (Ag), gold (Au), tin (Sn) or combinations thereof.

A penetration electrode 175 may be electrically connected to the second conductive pad 170C and the rerouting pattern 140 through the first reinforcement layer 160A and the first absorption layer 150A. The penetration electrode 175 may penetrate the second conductive pattern 170C. The penetration electrode 175 may be made of a conductive material such as metal or alloy. The penetration electrode 175 may include, for example, the same material as the rerouting pattern 140 and the second conductive pad 170C. The penetration electrode 175 may be, for example, a copper electrode. The penetration electrode 175 may be disposed on a portion of the rerouting pattern 140 spaced apart from the first conductive pattern 120. In order to make it easy to electrically connect the rerouting pattern 140 with the penetration electrode 175, the portion of the rerouting pattern 140 may have a width which is greater than a diameter of the penetration electrode 175. The diameter of the penetration electrode 175 may be that of a cross section formed by cutting the penetration electrode 175 in parallel with the top surface 102a of the substrate 102.

A second reinforcement layer 160B may be disposed on the bottom surface 102b of the semiconductor chip 102. The second reinforcement layer 160B may include the same material the first reinforcement layer 160A. The second reinforcement layer 160B may serve to prevent warpage of the semiconductor chip 102 which results from the first reinforcement layer 160A. A second absorption layer 150B may be interposed between the bottom surface 102b and the second reinforcement layer 160B. The second absorption layer 150B may include the same material as the first absorption layer 150A. However, if the second absorption layer 150B rarely affects the warpage of the semiconductor chip 102 and the reliability of the semiconductor device, it may be omitted.

Thicknesses of the second absorption layer 150B, the second reinforcement layer 160B, a conductive layer 170B, and a third insulating layer 180B may be determined to correspond to those of the first absorption layer 150A, the first reinforcement layer 160A, the second conductive pad 170C, and a second insulating layer 180A, respectively. The total thickness of the first absorption layer 150A, the first reinforcement layer 160A, the second conductive pad 170C, and the second insulating layer 180A may be determined considering the thickness of the package 200.

The first reinforcement layer 160A may have the same thickness as the first absorption layer 150A and may be different thickness from at least one of the first insulation layer 135 and the second insulation layer 180A in the direction Y. However, the present genera inventive concept is not limited thereto. Thicknesses of the first reinforcement layer 160A and the first absorption layer 150A may be different from each other. It is possible that the thickness of the first absorption layer 150A may be thicker than that of the first reinforcement layer 160A. However, it is also possible that the thickness of the first absorption layer 150A may not be thicker than that of the first reinforcement layer 160A.

Although FIG. 1 illustrates the second reinforcement layer 160B thicker than the second absorption layer 150B. However, the present general inventive concept is not limited thereto. It is possible that the second absorption layer 150B and the second reinforcement layer 160B may have the same thickness. It is also possible that the second absorption layer 150B and the second reinforcement layer 160B may have different thickness from each other as illustrated in FIG. 1.

The first reinforcement layer 160A and the second reinforcement layer 160B may have the same thickness. However, the present general inventive concept is not limited thereto. It is possible that the first reinforcement layer 160A and the second reinforcement layer 160B may have different thicknesses.

The first absorption layer 150A and the second absorption layer 150B may have the same thickness. However, the present general inventive concept is not limited thereto. It is possible that the first absorption layer 150A and the second absorption layer 150B may have different thicknesses.

Although the first insulating layer 135 is formed between the semiconductor chip 102 and the first absorption layer 150A, there may not be an insulating layer between the semiconductor chip 102 and the second absorption layer 150B. However, it is possible that an insulating layer can be formed between the semiconductor chip 102 and the second absorption layer 150B.

The conductive layer 170B may be formed to be electrically connected to at least one of the integrated circuit of the semiconductor chip 102 through a conductor material (not illustrated) formed through the second absorption layer 150B and the second reinforcement layer 160B. The conductive layer 170B may be electrically connected to an external device or another semiconductor package. The external device and/or the another semiconductor package may not be mounted to the mounting substrate 300. However, it is possible that the external device and/or the another semiconductor package may be mounted to the mounting substrate 300 according to a similar method in which the semiconductor package 200 is mounted to the mounting substrate 300.

The mounting substrate 300 may have a bottom portion 301, a top portion 302, and a side portion 303 or 304. The mounting substrate 300 may further include one or more pads 300a formed on or in the bottom portion 301, one or more pads 300b formed on or in the top portion 302, and one or more side pads formed on or in the side portion 303 or 304. The mounting substrate 300 may further include one or more conductive wirings 310a, 310b, 310c, and 310d to electrically connect the connection terminals 190 to the corresponding pads 300a, 300b, 300c, and 300d. The conductive wirings 310a, 310b, 310c, and 310d may be one or more wiring portions disposed parallel to the direction X and/or the Y direction.

The mounting substrate 300 may have a length longer than the semiconductor package 200 in the direction X such that another external device or another semiconductor package or another semiconductor chip can be mounted on the mounting substrate 300 through the pads 300a to be parallel to the semiconductor package 200 with respect to the mounting substrate 300 in the X direction.

It is possible that the external device and/or another semiconductor package can be connected to the semiconductor package 200 through the pads 300d through the conductive wiring 310d.

The semiconductor package 200 may be different from the external device or the another semiconductor package in volume, size, thickness in the direction Y, or length in the direction X.

Although FIG. 1 illustrates the second conductive pad 170c disposed at a position different from a position of the corresponding first conductive pad 120 in the direction X, it is possible that positions of the second conductive pad 170c and the first conductive pad 120c may be same with respect to the direction X.

It is also possible that a first number of the second conductive pads 170c are disposed at positions different from positions of the corresponding pads 120, and a second number of the second conductive pads 170c are disposed at the same positions of the corresponding pads 120 with respect to direction X.

FIGS. 2A through 2F are cross-sectional views illustrating a method of manufacturing a semiconductor device according to an embodiment of the present general inventive concept.

Figure 2A:
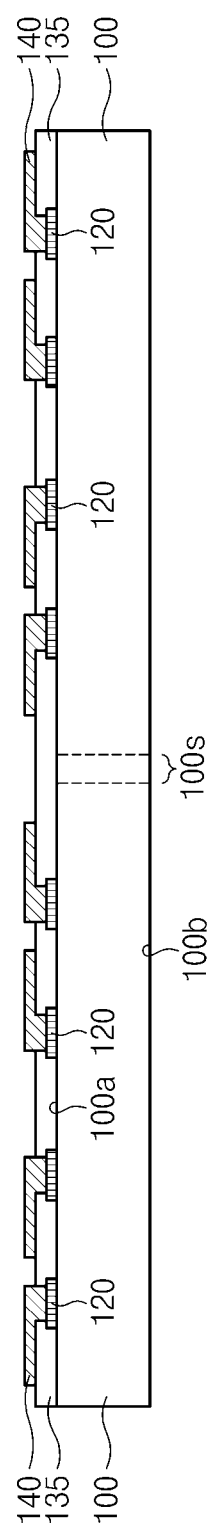

Referring to FIG. 2A, a substrate 100 having a top surface 100a and a bottom surface 100b opposite to the top surface 100a is prepared. An integrated circuit (not shown) is provided at the substrate 100, and a first conductive pad 120 is formed on the top surface 100a to be electrically connected to the integrated circuit. The first conductive pad 120 may be formed of a conductive material such as metal, e.g., aluminum (Al), copper (Cu) or nickel (Ni) or alloy. The substrate 100 may be divided by a scribe lane 100s that is a chip cutting area, and the first conductive pad 120 may comprise a plurality of conductive pads. When the substrate 100 is prepared, a substrate thinning process may be carried out to polish the bottom surface 100b. The substrate thinning process may be a grinding process or a chemical mechanical polishing (CMP) process.

A first insulating layer 135 having openings is formed to cover the top surface 100a and the edge of the first conductive pad 120 and to expose the first conductive pad 120. The first insulating layer 135 may be formed of, for example, oxide, nitride or a polymeric dielectric material such as polyimide. The polymeric dielectric material may be formed by means of a spin coating process.

A rerouting pattern 140 may be formed to be electrically connected to the exposed first conductive pad 120 and to laterally extend along the top surface of the first insulating layer 135. The rerouting pattern 140 may be, for example, a conductive pattern including copper (Cu). In order to make it easy to electrically connect the rerouting pattern 140 with a penetration electrode (175 of FIG. 2D) formed later, a portion of the rerouting pattern 140 may be formed to have a width which is greater than a diameter of the penetration electrode 175. The portion of the rerouting pattern 140 may have a circular shape corresponding to a circular cross section of the penetration electrode 175.

Figure 2B:
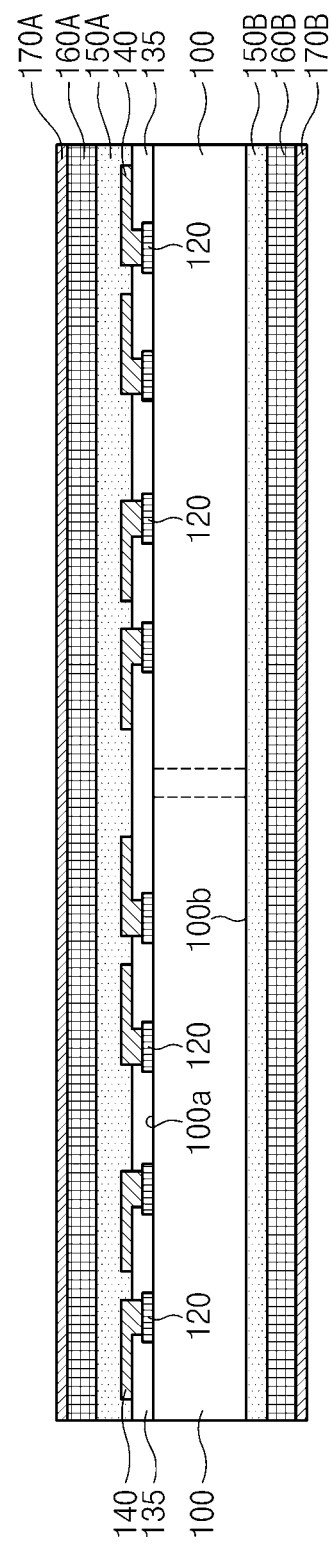

Referring to FIG. 2B, a first absorption layer 150A is formed on the first insulating layer 135 to cover the rerouting pattern 140. A first reinforcement layer 160A is attached to the first absorption layer 150A. The first absorption layer 150A may be formed by means of a dispensing process. The first absorption layer 150A may include a material having a smaller elastic modulus than the first reinforcement layer 160A and a semiconductor chip (102 of FIG. 2F) have. The first absorption layer 150A may include, for example, an epoxy or acryl-based liquid or film type adhesive or a silicon-based liquid or film type adhesive.

The first reinforcement layer 160A may include an electrical insulating layer having the substantially same thermal expansion coefficient as a mounting substrate (300 of FIG. 2F) on which a semiconductor package (200 of FIG. 2F) according to the present invention will be loaded, or having a thermal expansion coefficient between those of the semiconductor chip 102 and the mounting substrate 300. The first reinforcement layer 160A may include a material having a thermal expansion coefficient between those of the semiconductor package 200 and the mounting substrate 300. The first reinforcement layer 160A may include fiber reinforced plastics. The first reinforcement layer 160A may be formed of an epoxy resin-embedded glass fiber. A substrate thinning process may cause the strength of the semiconductor chip 102 to be weakened, which may be compensated by the first reinforcement layer 160A.

A first conductive layer 170A may be attached on the first reinforcement layer 160A. The first conductive layer 170A may include the same kind of material as the rerouting pattern 140. The first absorption layer 150A, the first reinforcement layer 160A, and the first conductive layer 170A may be compressed by a roller or a laminating press. The first absorption layer 150A and the first reinforcement layer 160A may be cured by means of a curing process.

A second reinforcement layer 160B may be formed on the bottom surface 100b of the semiconductor substrate 100. The second reinforcement layer 160B may be, for example, the same kind of layer as the first reinforcement layer 160A. The second absorption layer 150B may be formed at the same as the first absorption layer 150A. However, if the second absorption layer 150B rarely affects the warpage of the substrate 100, it may be omitted.

A second conductive layer 170B may be formed on the second absorption layer 150B. The second conductive layer 170B may include the same material as the first conductive layer 170A. The second conductive layer 170B may be formed at the same time as the first conductive layer 170A. However, if the second conductive layer 170B rarely affects the warpage of the substrate 100, it may also be omitted.

Referring to FIG. 2C, a via formation process is performed to form a via 172 which perpendicularly penetrates the first absorption layer 150A and the first reinforcement layer 160A. The via 172 may penetrate the first conductive layer 170A. The via 172 may be, for example, a cylindrical hole exposing the rerouting pattern 140. A diameter of the cylindrical hole may be greater than a width of the rerouting pattern 140. The via formation process may be a laser drilling process, which has the advantages that it is not necessary to form a mask or perform a photolithography process and it is possible to readily set depth or width of the via 172. The via formation process may include a dry etching process. During the formation of the via 172, the first conductive layer 170A, the first absorption layer 150A, and the first reinforcement layer 160A are partially removed but the rerouting pattern 140 is not removed. That is, the rerouting pattern 140 acts as an etch stopper during the laser drilling process.

Referring to FIG. 2D, a penetration electrode 175 may be formed by means of a via filling process of filling the via 172 with a conductor (conductive material). The conductor may adopt the same or similar material as or to metal or alloy constituting the rerouting pattern 140. The conductor may adopt, for example, copper (Cu). The via filling process may be a plating process or a stencil printing process. A planarization process may be additionally performed to make a top surface of the penetration electrode 175 and a top surface of the first conductive layer 170A coplanar with each other.

In a case that the plating process is performed, a seed conductor may be formed on an inner wall of the via 172. The seed conductor may be formed by means of electroless plating or physical vapor deposition (PVD) using vacuum. Thicknesses of the first reinforcement layer 160A and the first absorption layer 150A may be individually controlled. In case a first thin reinforcement layer 160A is attached, a via formation process may be readily performed.

A second conductive pad 170C may be formed by patterning a first conductive layer (170A of FIG. 2C) electrically connected to the penetration electrode 175. The second conductive pad 170C is electrically connected to the penetration electrode 175 and the rerouting pattern 140. The second conductive pad 170C may be disposed on a portion of the rerouting pattern 140 spaced apart from the first conductive pad 120. The second conductive pad 170C may comprise a plurality of second conductive pads disposed adjacent to a scribe lane 100s, and the penetration electrode 175 may also comprise a plurality of penetration electrodes disposed adjacent to the scribe lane 100s. The dispositions of the second conductive pad 170C and the penetration electrode 175 are not limited to the foregoing.

Figure 2E:
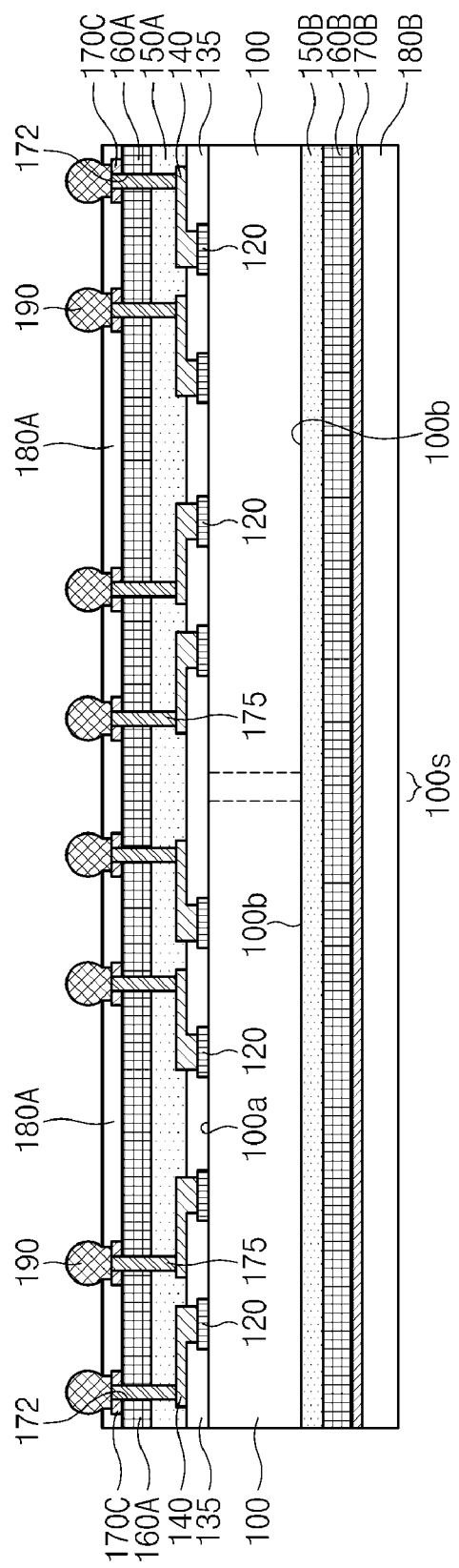

Referring to FIG. 2E, a second insulating layer 180A may be formed to cover the first reinforcement layer 160A while exposing the second conductive pad 170C. The second insulating layer 180A may be formed of an insulative material such as, for example, photo solder resist (PSR), which may be a liquid or film-type PSR. A connection member 190, such as a solder ball, may be provided to a top surface of the second conductive pad 170C. The second conductive pad 170C may be electrically connected to an external circuit through the connection member 190. Before providing the connection member 190, a metal base pattern (not shown) may be formed on the top surface of the second conductive pad 170C. The metal base pattern may include, for example, a nickel layer and a gold layer which are stacked in the order named.

A third insulating layer 180B may be formed on the second conductive layer 170B of the bottom surface 100b of the substrate 100. The third insulating layer 180B may include the same material as the second insulating layer 180A. The third insulating layer 180B may exhibit a beautiful color or a dark color. The third insulating layer 180B may be formed at the same time as the second insulating layer 180A. However, if the third insulating layer 180B rarely affects the warpage of the substrate 100, it may be omitted.

Figure 2F:
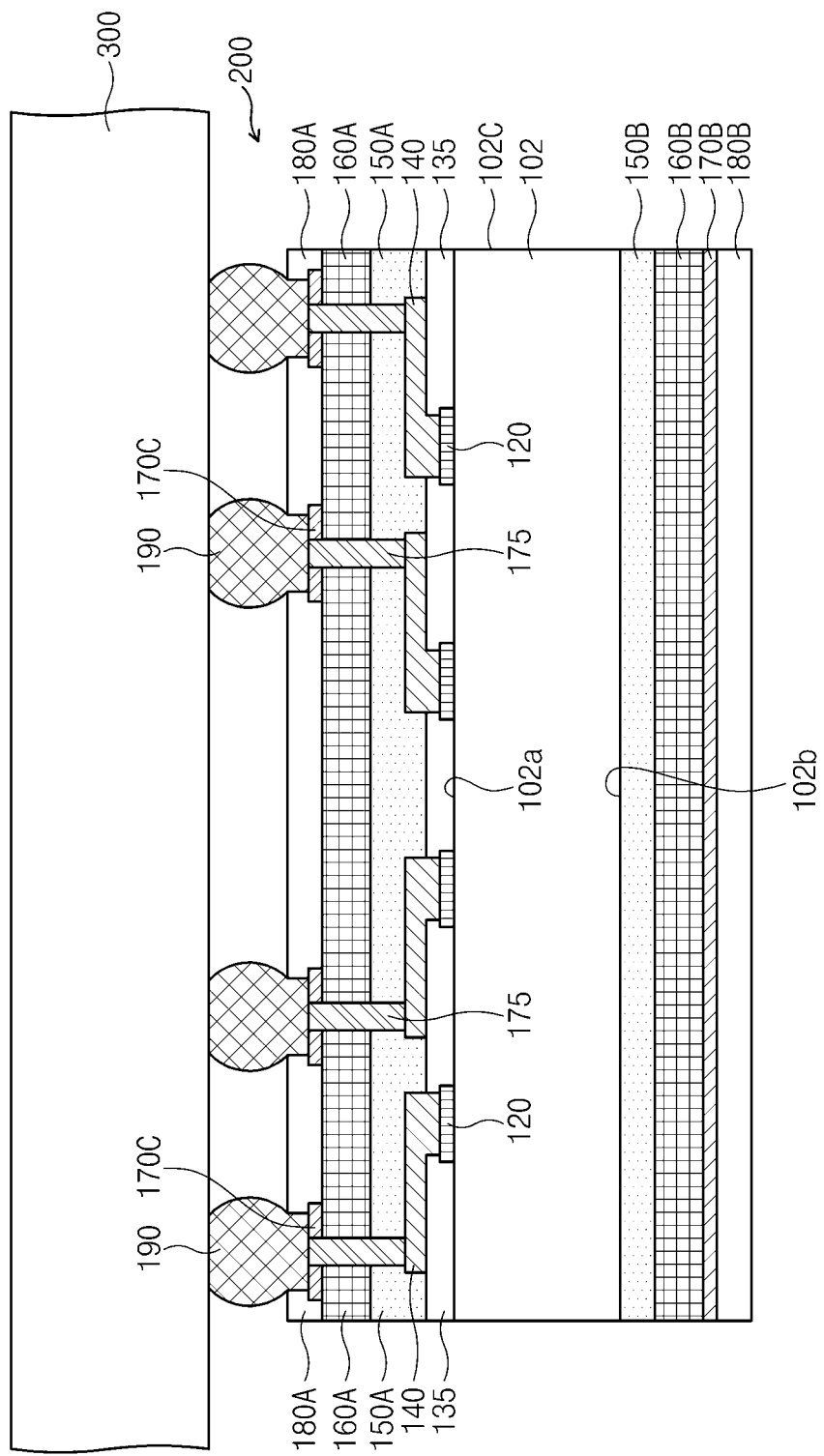

Referring to FIG. 2F, the substrate 100 is cut along a scribe lane (100s of FIG. 2E) to form a semiconductor package 200 including a semiconductor chip 102. The cutting process may be, for example, a sawing process. Due to the cutting process, a side surface 102c of the semiconductor chip 102 may be coplanar with an end surface of the first reinforcement layer 160A, and an end surface of the first absorption layer 150A may be coplanar with the side surface 102c of the semiconductor chip 102. The package 200 may be a wafer level chip scale package (WL-CSP).

The package 200 is mounted to a mounting substrate 300, which may include a conductive wiring (not shown) provided to transmit an electrical signal. The mounting substrate 300 may be, for example, a substrate 300 including a resin. A connection terminal 190 of the semiconductor package 200 is electrically connected to the conductive wiring of the mounting substrate 300. According to the embodiment of the present invention, a first reinforcement layer 160A and a first absorption layer 150A may be formed between the connection terminal 190 and the first insulating layer 135 to provide a semiconductor device having improved chemical strength and reliability.

Figure 3:
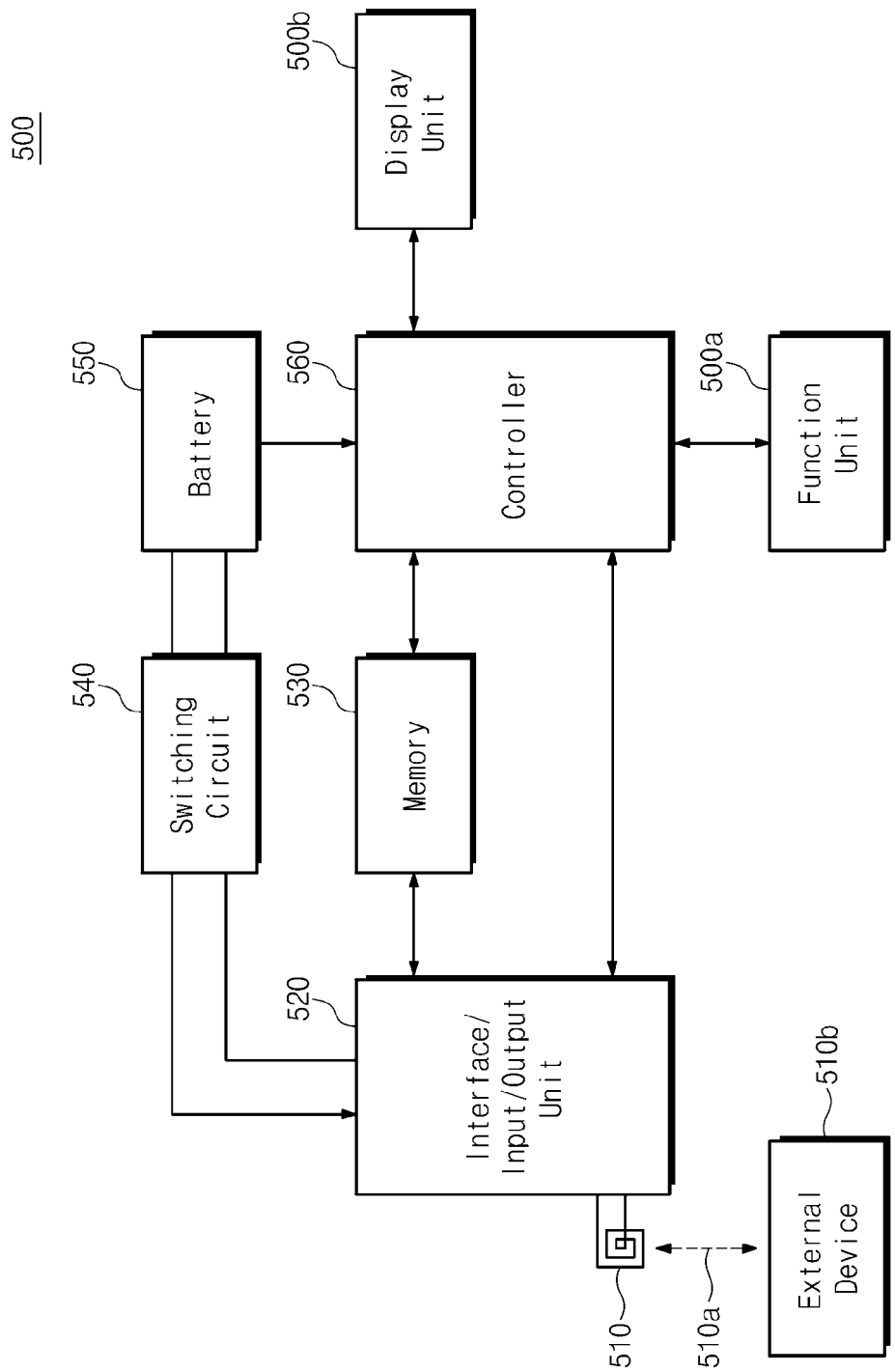
FIG. 3 is a block diagram illustrating a system of an electronic apparatus including a semiconductor device according to an embodiment of the present general inventive concept.

FIG. 3 is a block diagram illustrating a system of an electronic apparatus including a semiconductor device according to the embodiments of the present general inventive concept. The electronic system may include a terminal device or a portable device, such as a mobile communication terminal 500 including, for example, an interface/input/output unit or a wired or wireless communication unit, such as a radio frequency communication chip (RF chip) 520, a memory unit such as a smart card 530, a switching circuit 540, a battery 550, and a controller 560. The mobile communication terminal 500 may include a semiconductor device according to embodiments of the present general inventive concept. That is, the mobile communication terminal 500 may include a semiconductor device having improved chemical strength and reliability.

The semiconductor device according to the embodiments of the present general inventive concept may be manufactured with a memory chip or a logic chip. The RF chip 520 may include, for example, a process and a memory chip. The smart card 530 may include a memory chip, and the controller 560 may include a logic chip to store data and process the data.

The RF chip 520 transmits/receives wireless signals 510a to/from an external device 510b, such as an external RFID reader through an antenna 510. The RF chip 520 transmits a signal received from the smart card 530 or the controller 560 to the RFID reader and transmits a signal received from the RFID reader through the antenna 510 to the smart card 530 or the controller 560. The smart card 530 communicates with the RF chip 520 and the controller 560. The battery 550 supplies power that the mobile communication terminal 500 needs. The controller 560 controls general operations of the mobile communication terminal 500.

The electronic apparatus 500 may have a function unit 500a to perform its own function and operation of the electronic apparatus 500, and a display unit 500b to display an image on a screen thereof according to a signal generated from the controller 560 to represent data performed in the function unit 500a and/or other unit of the electronic apparatus 500. For example, if the electronic apparatus 500 is a mobile communication terminal or phone, the function unit 500a may be a telecommunication function unit to communicate with another mobile communication terminal, a wired phone terminal, or a communication station or server system, to transmit data, to process data, to store data in the memory unit 530, and so on. The display unit 500b may be mounted on a body of the electronic apparatus 500. It is possible that the display unit 500b may be connected to the controller 560 through a communication line to receive data from the controller 560 and to display an image according to the received data. Since the function unit 500a and the display unit 500b are well known, detail descriptions thereof will be omitted.

The semiconductor device illustrated in FIGS. 1 through 2F can be used as at least one element or unit of the electronic apparatus 500, for example, the memory unit 530, the controller 560, and/or the interface/input/output unit 520. It is possible that two or more elements of the electronic apparatus 500 can be mounted to the mounting substrate 300 as the semiconductor device. As described above, when the semiconductor device is used as the at least one of the elements or units of the electronic apparatus 500, at least one of the pads 300a, 300b, 300c and/or 300d or at least a portion of the conductive layer 170B can be connected to at least one other element or unit of the electronic apparatus such that data can be transmitted therebetween through the pads or the conductive layer 170B.

The electronic apparatus including a semiconductor device according to the embodiments of the present general inventive concept may include, for example, not only a mobile communication terminal 500 but also various mobile devices such as personal digital assistants (PDA), MP3 players, movie players, portable game machines, etc., desktop computers, mainframe computers, global positioning systems (GPS), PC cards, notebook computers, camcorders, and digital cameras.

Although the present invention has been described in connection with the embodiment of the present general inventive concept illustrated in the accompanying drawings, it is not limited thereto. It will be apparent to those skilled in the art that various substitutions, modifications and changes may be made without departing from the scope and spirit of the general inventive concept.

What is claimed is:

1. A semiconductor device comprising:
   a semiconductor chip having a top surface on which a first conductive pad is disposed, a bottom surface opposite to the top surface, and a side surface connecting the top and bottom surfaces to each other;
   a first reinforcement layer disposed on the top surface of the semiconductor chip and formed with the first conductive pad;
   a first absorption layer formed between the top surface of the semiconductor chip and the first reinforcement layer to absorb a stress resulting from a difference in thermal expansion coefficient between the first reinforcement layer and the semiconductor chip; and
   a connection terminal disposed on the first reinforcement layer and electrically connected to the first conductive pad,
   wherein the top surface is formed with the first reinforcement layer and the first absorption layer, and the bottom surface is formed with a second reinforcement layer and a second absorption layer.

2. The semiconductor device of claim 1, wherein the first absorption layer includes a material having a smaller elastic modulus than the first reinforcement layer and the semiconductor chip have.

3. The semiconductor device of claim 1, further comprising:
   a mounting substrate to which the semiconductor chip is mounted.

4. The semiconductor device of claim 3, wherein the connection terminal is disposed between the mounting substrate and the first reinforcement layer.

5. The semiconductor device of claim 3, wherein the first reinforcement layer includes a material having the same thermal expansion coefficient as the mounting substrate or having a thermal expansion coefficient between those of the mounting substrate and the semiconductor chip.

6. The semiconductor device of claim 3, further comprising:
   a first insulating layer to cover the top surface of the semiconductor chip while exposing the first conductive pad;
   a rerouting pattern electrically connected to the first conductive pad and extending along a top surface of the first insulating layer;
   a second conductive pad between the connection terminal and the first reinforcement layer and on a portion of the rerouting pattern; and
   a penetration electrode to penetrate the first reinforcement layer and the first absorption layer and to electrically connect the second conductive pad to the rerouting pattern.

7. The semiconductor device of claim 6, wherein a portion of the rerouting pattern has a width that is greater than a diameter of the penetration electrode.

8. The semiconductor device of claim 6, further comprising:
   a second insulating layer to cover the edge of the second conductive pad and a lower portion of the connection terminal.

9. The semiconductor device of claim 6, further comprising:
   a second reinforcement layer on the bottom surface of the semiconductor chip and the second reinforcement layer including the same material as the first reinforcement layer includes.

10. The semiconductor device of claim 9, further comprising:
    a second absorption layer between the bottom surface of the semiconductor chip and the second reinforcement layer including the same material as the first absorption layer includes.

11. A semiconductor device comprising:
    a semiconductor package comprising,
      a semiconductor chip comprising a first surface and a second surface;
      a layer disposed on the semiconductor chip and formed with a pad electrically connected to the semiconductor chip; and
      an absorption layer formed between the semiconductor chip and the layer to absorb a force between the semiconductor chip and the layer,
    wherein the first surface is formed with the layer and the absorption layer, and the second surface is formed with a second layer and a second absorption layer.

12. The semiconductor device of claim 11, wherein the layer comprises a reinforcement layer having a thermal expansion coefficient different from the semiconductor chip.

13. The semiconductor device of claim 12, further comprising:
    an insulating layer formed between the semiconductor chip and the absorption layer.

14. The semiconductor device of claim 12, wherein the layer has a thickness different from a thickness of the second layer, and the absorption layer has a thickness different from a thickness of the second absorption layer.

15. The semiconductor device of claim 11, wherein the absorption layer has a thickness determined according to a characteristic of one of the semiconductor chip and the layer.

16. The semiconductor device of claim 11, further comprising:
a mounting substrate mounted with the semiconductor package; and
one or more connecting terminals formed between the mounting substrate and the corresponding pad of the semiconductor package.

17. The semiconductor device of claim 16, wherein the connecting terminals have a thickness thicker than a thickness of at least one of the layer and the absorption layer.

18. The semiconductor device of claim 16, wherein the mounting substrate comprises a substrate pad and a conductor wiring to electrically connect the substrate pad and the semiconductor chip, and the mounting substrate has a length longer than the semiconductor package.

19. A semiconductor device comprising:
a semiconductor chip having a top surface on which a first conductive pad is disposed, a bottom surface opposite to the top surface, and a side surface connecting the top and bottom surfaces to each other;
a mounting substrate to which the semiconductor chip is mounted;
a first reinforcement layer disposed on the top surface of the semiconductor chip;
a first absorption layer formed between the top surface of the semiconductor chip and the first reinforcement layer to absorb a stress resulting from a difference in thermal expansion coefficient between the first reinforcement layer and the semiconductor chip;
a connection terminal disposed on the first reinforcement layer and electrically connected to the first conductive pad;
a first insulating layer to cover the top surface of the semiconductor chip while exposing the first conductive pad;
a rerouting pattern electrically connected to the first conductive pad and extending along a top surface of the first insulating layer;
a second conductive pad between the connection terminal and the first reinforcement layer and on a portion of the rerouting pattern;
a penetration electrode to penetrate the first reinforcement layer and the first absorption layer and to electrically connect the second conductive pad to the rerouting pattern; and
a second reinforcement layer on the bottom surface of the semiconductor chip and the second reinforcement layer including the same material as the first reinforcement layer includes.

* * * * *